(12) United States Patent
Qiao et al.

(10) Patent No.: US 10,901,000 B2
(45) Date of Patent: Jan. 26, 2021

(54) ELECTRICAL TESTING JIG

(71) Applicants: BOE Technology Group Co., Ltd., Beijing (CN); Hefei Xinsheng Optoelectronics Technology Co., Ltd., Anhui (CN)

(72) Inventors: Kai Qiao, Beijing (CN); Han Chen, Beijing (CN); Peihuan Ning, Beijing (CN); Shilin Zhu, Beijing (CN); Wei Sun, Beijing (CN); Bin Wan, Beijing (CN); Weiquan Zeng, Beijing (CN); Zhuoyan Ni, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei (CN)

( * ) Notice: Subject to any disclaimer, the term of this patent is extended or adjusted under 35 U.S.C. 154(b) by 358 days.

(21) Appl. No.: 15/964,781

(22) Filed: Apr. 27, 2018

(65) Prior Publication Data

US 2019/0049487 A1 Feb. 14, 2019

(30) Foreign Application Priority Data

Aug. 14, 2017 (CN) .................... 2017 2 1013215 U

(51) Int. Cl.
*G01R 1/04* (2006.01)
*G01R 31/69* (2020.01)

(52) U.S. Cl.
CPC ......... *G01R 1/0466* (2013.01); *G01R 1/0408* (2013.01); *G01R 31/69* (2020.01)

(58) Field of Classification Search
CPC .... G01R 1/0466; G01R 31/69; G01R 1/0408; H01L 21/67766; H01L 23/3121; A61N 1/36
USPC ......... 324/500, 755.05, 755.01, 534, 750.05, 324/750.15, 750.3, 754.23, 756.02, 324/756.05; 361/752; 345/173, 204
See application file for complete search history.

(56) References Cited

U.S. PATENT DOCUMENTS

2013/0038559 A1* 2/2013 Byeon ..................... H05K 5/03
345/173

FOREIGN PATENT DOCUMENTS

| CN | 201878430 U | * | 6/2011 | .............. B23P 19/00 |
| CN | 10519035 B | * | 12/2015 | ............... B23C 3/13 |

* cited by examiner

*Primary Examiner* — Vincent Q Nguyen
*Assistant Examiner* — Trung Nguyen
(74) *Attorney, Agent, or Firm* — Westman, Champlin & Koehler, P.A.

(57) ABSTRACT

An electrical testing jig includes: a substrate; a first bracket on the substrate, the first bracket having a first step extending in a first direction on a top of the first bracket; and a second bracket on the substrate, the second bracket being spaced apart from the first bracket in a second direction perpendicular to the first direction and having two second steps spaced apart from each other in the first direction on a top of the second bracket. Each of the second steps is angular.

17 Claims, 3 Drawing Sheets

ELECTRICAL TESTING JIG

CROSS-REFERENCE TO RELATED APPLICATION

This application claims the benefit of Chinese Patent Application No. 201721013215.2 filed on Aug. 14, 2017 in the State Intellectual Property Office of China, the disclosure of which is incorporated herein by reference in entirety.

BACKGROUND

Technical Field

Embodiments of the present disclosure relate to the field of electrical testing device, and in particular, to an electrical testing jig.

Description of the Related Art

Currently, an electrical testing method adopted in a touch screen industry for final testing uses PoGo-Pin-Jig (an electrical testing jig based on a PoGo-Pin connector) to test a product. Since an S-surface (a sensor-sided surface, i.e., a side surface of the product for wiring) of the product in this testing method is in complete contact with a surface of a substrate of the jig, it will affect a capacitance value during the testing, resulting in a misjudgment of an electrical testing result of the product. Moreover, since the substrate directly contacts with the S-surface of the product, the above-mentioned electrical testing method also has a risk that the surface of the substrate scratches the S-surface of the product, which is likely to cause secondary defects. Furthermore, in the above-mentioned electrical testing method, since it is necessary for an operator to manually transfer a barcode on the S-surface to a G-surface (a glass-sided surface, i.e., a side surface of the product for providing a glass substrate), and scan the codes on the G-surface of the product in the electrical testing process, thereby resulting in longer working hours. In addition, the electrical testing jig used in the above-mentioned method cannot fix the product, which easily leads to plug-in trouble and causes electrical testing misjudgment.

SUMMARY

The embodiments of the present disclosure are mainly intended to provide an electrical testing jig that effectively fixes a product and avoids contacting with a functional area of a S-surface of the product, so as to at least partially overcome at least one of the disadvantages described above.

To this end, the embodiments of the present disclosure provide the following technical solutions:

According to an aspect of the present disclosure, there is provided an electrical testing jig for carrying and positioning a touch screen, comprising:

a substrate;

a first bracket on the substrate, the first bracket having a first step extending in a first direction on a top thereof; and a second bracket on the substrate, the second bracket being spaced apart from the first bracket in a second direction perpendicular to the first direction and having two second steps spaced apart from each other in the first direction on a top of the second bracket, each of the second steps being angular.

According to an embodiment of the present disclosure, the substrate is provided with a first slideway extending in the second direction, and the first bracket cooperates with the first slideway slidably.

According to an embodiment of the present disclosure, the substrate is provided with a first slideway extending in the second direction, and the second bracket cooperates with the first slideway slidably.

According to an embodiment of the present disclosure, two positioning blocks spaced apart from each other in the first direction are provided on the top of the second bracket, each of the positioning blocks having an angular notch, and the second steps are respectively formed at two angular notches.

According to an embodiment of the present disclosure, a second slideway extending in the first direction is provided on the top of the second bracket, and at least one of the two positioning blocks cooperates slidably with the second slideway.

According to an embodiment of the present disclosure, the two positioning blocks both cooperate with the second slideway.

According to an embodiment of the present disclosure, the electrical testing jig further comprises an electrical connection assembly on the first bracket or the second bracket, wherein, the touch screen is carried and positioned on the electrical testing jig, and a circuit board of the touch screen is connected to an external circuit through the electrical connection assembly.

According to an embodiment of the present disclosure, the electrical connection assembly is position-adjustable on the first bracket or the second bracket.

According to an embodiment of the present disclosure, an FPC board is formed on a side edge of the touch screen, and the electrical connection assembly comprises:

an FPC pad on the first bracket or the second bracket; and an FPC pressure head on the FPC pad;

wherein, the touch screen is carried and positioned on the electrical testing jig, and the FPC board is configured to rest against the FPC pad and connected to the FPC pressure head, so as to be connected to the external circuit through the FPC pressure head.

According to an embodiment of the present disclosure, the touch screen is carried and positioned on the electrical testing jig, and an S-surface of the touch screen faces the substrate, and the S-surface is provided with a panel label, and the electrical testing jig further comprises:

a reflector, on the substrate and between the first bracket and the second bracket, configured to project an image of the panel label to be scanned by a tester; or a code scanner, on the substrate and between the first bracket and the second bracket, configured to scan codes on the panel label.

According to an embodiment of the present disclosure, the substrate is provided with a first slideway extending in the second direction, and the first bracket and the second bracket both cooperate with the first slideway slidably.

According to an embodiment of the present disclosure, the electrical testing jig comprises one, two or more first slideways.

According to an embodiment of the present disclosure, a second slideway extending in the first direction is provided on the top of the second bracket, and at least one of the two positioning blocks cooperates with the second slideway, wherein the electrical testing jig further comprises an electrical connection assembly on the second bracket, wherein, the touch screen is carried and positioned on the electrical testing jig, and a circuit board of the touch screen is connected to an external circuit through the electrical connection assembly.

According to an embodiment of the present disclosure, the electrical connection assembly cooperates with the second slideway and is located between the two positioning blocks.

According to an embodiment of the present disclosure, the substrate is provided with a first slideway extending in the second direction, and the first bracket and the second bracket both cooperate with the first slideway slidably, wherein two positioning blocks spaced apart from each other in the first direction are provided on the top of the second bracket, each of the positioning blocks having an angular notch, and the second steps are respectively formed at two angular notches.

BRIEF DESCRIPTION OF THE DRAWINGS

The various objects, features, and advantages of the present disclosure will become more apparent from the following detailed description of the optional embodiments of the present disclosure with reference to the accompanying drawings. The drawings are merely exemplary diagrams of the present disclosure and are not necessarily drawn to scale. In the drawings, the same reference numerals denote the same or similar components throughout the specification. In the drawings.

DETAILED DESCRIPTION OF PREFERRED EMBODIMENTS

Figure 1:
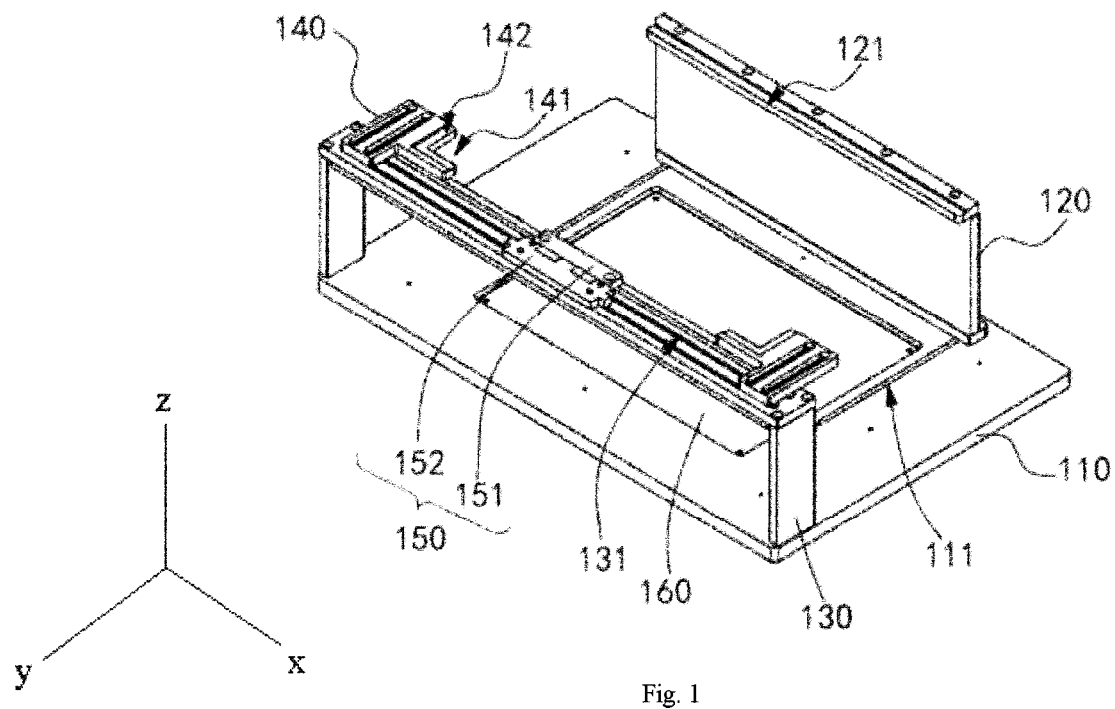
FIG. 1 is a perspective view of an electrical testing jig according to an exemplary embodiment.
Figure 2:
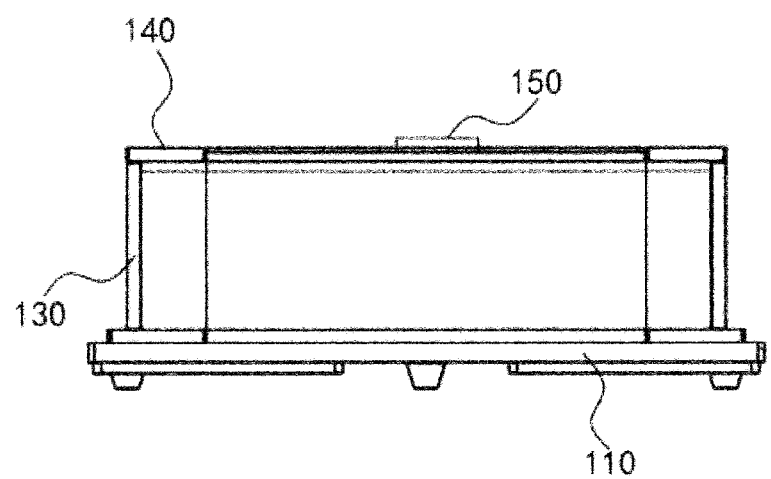
FIG. 2 is a front view of the electrical testing jig shown in FIG. 1.

Exemplary embodiments that embody features and advantages of the present disclosure will be described in detail in the following description. It is to be understood that various modifications may be made to various embodiments in the present disclosure without departing from the scope of the present disclosure, and that the description and drawings herein are illustrative in nature and are not intended to limit the present disclosure.

In the following description of various exemplary embodiments of the present disclosure, reference is made to the accompanying drawings that form a part of the present disclosure, and various exemplary structures, systems and steps for implementing various aspects of the present disclosure are exemplarily shown. It is to be understood that other specific solutions of components, structures, exemplary devices, systems, and steps may be used and structural and functional modifications may be made without departing from the scope of the present disclosure. Moreover, although the terms "end", "between", "side", etc. may be used in this specification to describe various exemplary features and elements of the present disclosure, these terms are only used herein for convenience, for example, based on the exemplary direction illustrated in the drawings. It should not be construed as requiring a specific three dimensional orientation of structure to fall within the scope of the present disclosure.

FIG. 1 representatively shows a perspective view of an electrical testing jig capable of embodying a principle of an embodiment of the present disclosure. In this exemplary embodiment, as an example, the electrical testing jig according to the embodiment of the present disclosure is an electric testing jig for carrying a component to be tested in an electrical testing experiment. Further, carrying a touch screen is taken as an example. It will be appreciated by those skilled in the art that, in order to apply the electrical testing jig to other types of components to be tested, various modifications, additions, substitutions, deletions or other changes may be made to the following specific embodiments, and such changes still fall within the scope of the electrical testing jig according to the embodiments of the present disclosure.

First of all, it should be noted that, the electrical testing jig according to this embodiment of the present disclosure is used for carrying and positioning a touch screen. Specifically, the touch screen has an S-surface and a G-surface opposite to each other. The S-surface is a side surface (sensor-sided surface) of the touch screen for wiring, and the G-surface is a side surface (glass-sided surface) of the touch screen for providing a glass substrate 110. Additionally, one side edge of the touch screen is also provided with an FPC (Flexible Printed Circuit) board.

Figure 3:
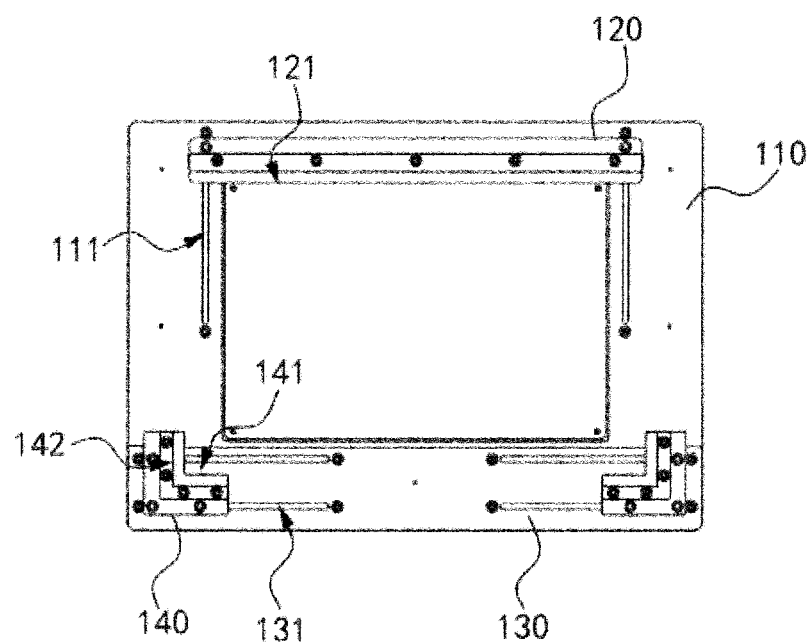
FIG. 3 is a top view of the electrical testing jig shown in FIG. 1.
Figure 4:
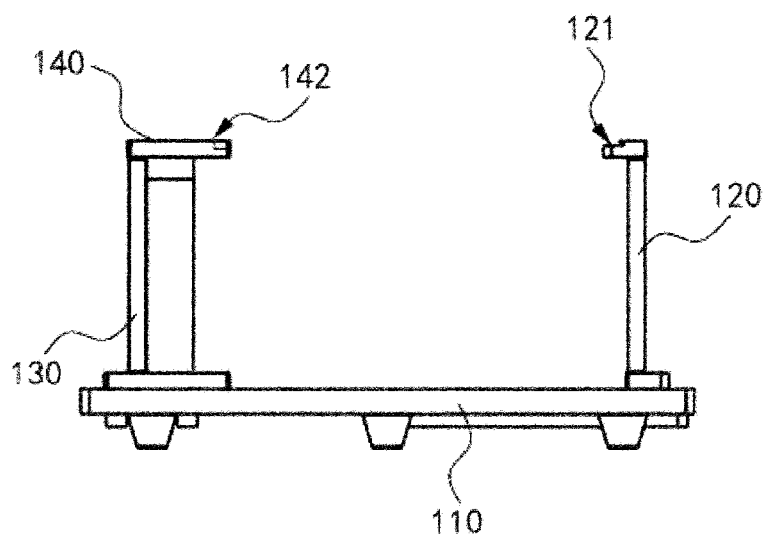
FIG. 4 is a side view of the electrical testing jig shown in FIG. 1.
Figure 5:
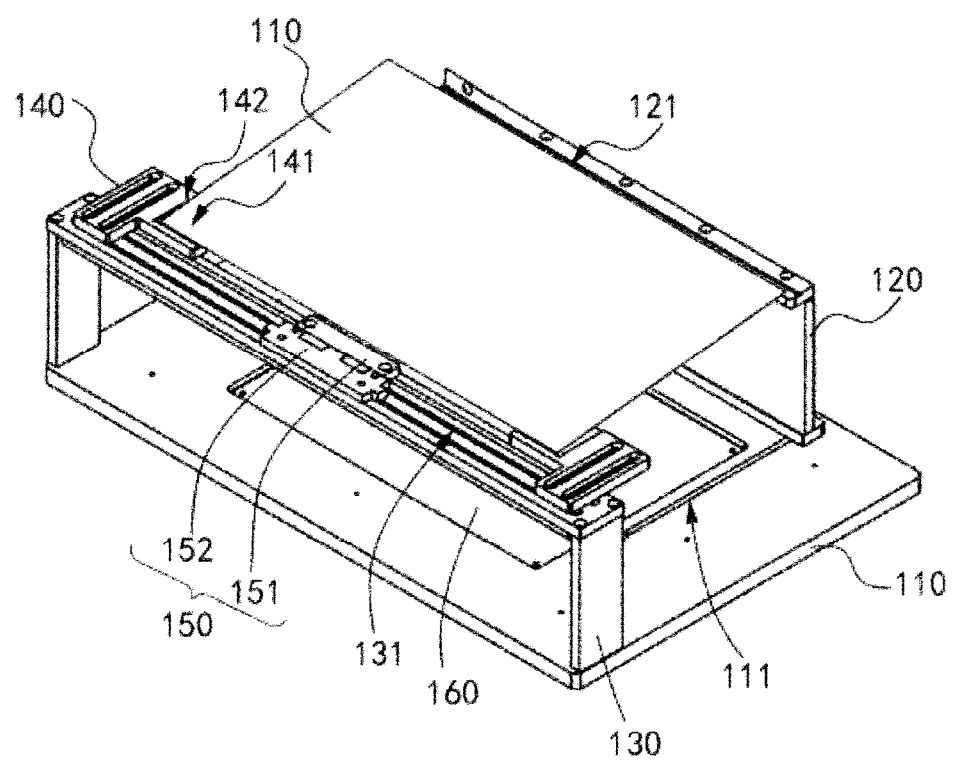
FIG. 5 is a schematic view of the electrical testing jig shown in FIG. 1 in an operation state of positioning a touch screen.

As shown in FIG. 1, the electrical testing jig according to this embodiment of the present disclosure mainly includes a substrate 110, a first bracket 120, a second bracket 130, two positioning blocks 140, an electrical connection assembly 150, and a reflector 160. With reference to FIG. 2 to FIG. 5, FIG. 2 representatively shows a front view of the electrical testing jig; FIG. 3 representatively shows a top view of the electrical testing jig; FIG. 4 representatively shows a side view of the electrical testing jig; FIG. 5 representatively shows a schematic view of the electrical testing jig in an operation state in which a touch screen is positioned on the electrical testing jig. The structure, connection mode and functional relationship of various main components of the electrical testing jig according to the embodiment of the present disclosure will be described in detail below in conjunction with the above drawings.

As shown in FIG. 1, in this embodiment, the first bracket 120 is slidably disposed on the substrate 110, and the first bracket 120 is formed with a first step 121 extending in a first horizontal direction or a first direction at a top thereof, the first step 121 is used for carrying and positioning a side edge of the touch screen. A sliding direction of the first bracket 120 on the substrate 110 is a second horizontal direction or a second direction, and the second horizontal direction is perpendicular to the first horizontal direction. The first horizontal direction or the first direction refers to a direction of x-axis in FIG. 1, and the second horizontal direction or the second direction refers to a direction of y-axis in FIG. 1.

Specifically, as shown in FIG. 1 and FIG. 3, in this embodiment, the substrate 110 is provided with two first slideways 111 extending in the second horizontal direction, and the two first slideways 111 respectively substantially correspond to two ends of the first bracket 120 in the first horizontal direction, and the first bracket 120 slidably cooperates with the two first slideways 111. The structural design of two first slideways 111 arranged at intervals may also facilitate arranging a reflector 160 or a code scanner between the two first slideways 111 on the substrate 110. The specific design will be described in the following specification, and will not be described now.

In other embodiments, the number of the first slideways 111 may also be set as one or more. The design of two first slideways 111 in this embodiment is done in view of sliding guide and reduction of occupied space, and other possible sliding fit designs may be incorporated by those skilled in the art into the embodiment of the present disclosure. Moreover, the first bracket 120 is not limited to the slidable arrangement on the substrate 110, the first bracket 120 may also be fixedly arranged on the substrate 110. The present disclosure is not limited thereto.

As shown in FIG. 1 and FIG. 4, in this embodiment, the second bracket 130 is fixedly disposed on the substrate 110, and the second bracket 130 and the first bracket 120 are disposed at intervals in the second horizontal direction.

In other embodiments, the second bracket 130 is not limited to the fixed arrangement on the substrate 110, and alternatively the second bracket 130 may also be slidably arranged on the substrate 110. The present disclosure is not limited thereto. Specifically, if the second bracket 130 is slidably arranged, a slideway extending in the second horizontal direction may be provided on the substrate 110, and the second bracket 130 slidably cooperates with the slideway so as to be slidably arranged on the substrate 110.

It should be appreciated that, the above-mentioned design of the first bracket 120 or the second bracket 130 slidably disposed on the substrate 110 has a main purpose of realizing an adjustment of a spacing between the first bracket 120 and the second bracket 130 so that the electrical testing jig is suitable for use in different sizes of touch screens. In this embodiment, since the first bracket 120 is disposed on the substrate 110 in a slidable manner, the second bracket 130 may be disposed on the substrate 110 in a fixed manner for the above design purpose. In other embodiments, the first bracket 120 may be fixedly disposed on the substrate 110, and the second bracket 130 may be slidably disposed on the substrate 110. Certainly, in view of different requirements for positioning the touch screen, the first bracket 120 and the second bracket 130 may also be disposed on the substrate 110 in a slidable manner, or may be disposed on the substrate 110 in a fixed manner. The present disclosure is not limited thereto.

As shown in FIG. 1, in this embodiment, the two positioning blocks 140 are slidably disposed on the top of the second bracket 130, and the two positioning blocks 140 are spaced apart from each other in the first horizontal direction. Specifically, each of the positioning blocks 140 has an angular notch 141 generally facing the first bracket 120, and the angular notch 141 of each of the positioning blocks 140 is formed with a second step 142 for carrying and positioning a corner of a side edge of the touch screen. In addition, a second slideway 131 extending in the first horizontal direction is provided on the top of the second bracket 130. The two positioning blocks 140 slidably cooperate with the second slideway 131. It is possible to provide two second slideways 131 or two sets of second slideways 131 respectively corresponding to the two positioning blocks 140 (as shown in FIG. 3), which may be flexibly designed according to needs. When the touch screen is carried and positioned on the electrical testing jig, one side edge of the touch screen is carried on the first step, and two corners of the opposite side edge are respectively carried and positioned on the two second steps.

By means of the above structural design, as shown in FIG. 5, when the touch screen is placed in the electrical testing jig, one side edge of the touch screen is carried and positioned on the first step 121, and two corners of the other side edge of the touch screen opposite to the said one side edge are respectively carried and positioned on the two second steps 142. In addition, in other embodiments, the arrangement positions of the second steps 142 can be flexibly selected to achieve the above positioning function. If not considering additional functions such as applicability for different sizes of touch screens, two second steps 142 that are angular can be formed on the top of the second bracket 130 and disposed at intervals in the first horizontal direction, so as to achieve the basic carrying and positioning function of the electrical testing jig.

It should be appreciated that, the above-mentioned design of the two positioning blocks 140 slidably disposed on the second bracket 130 has a main purpose of realizing an adjustment of a spacing between the two positioning blocks 140 so that the electrical testing jig is suitable for use in different sizes of touch screens. For the above design purpose, in other embodiments, at least one of the two positioning blocks 140 may be disposed on the second bracket 130 in a slidable manner Certainly, in view of different requirements for positioning the touch screen, the two positioning blocks 140 may also be disposed on the second bracket 130 in a fixed manner. The present disclosure is not limited thereto.

As shown in FIG. 1 and FIG. 3, in this embodiment, the electrical connection assembly 150 is provided on the second bracket 130 to electrically connect for example an FPC of the touch screen to the external circuit via it when the touch screen is carried and positioned on the electrical testing jig. In order to be adapted to different lead-out positions of the FPCs of different types of touch screens, in this embodiment, the electrical connection assembly 150 slidably cooperates with the second slideway 131 and is located between the two positioning blocks 140, i.e., the electrical connection assembly 150 is disposed on the second bracket 130 in a slidable manner.

Further, as shown in FIG. 1, in this embodiment, the electrical connection assembly 150 mainly includes an FPC pad 151 and an FPC pressure head 152. Specifically, the FPC pad 151 slidably cooperates with the second slideway 131 so as to be slidably disposed on the second bracket 130. The FPC pressure head 152 is disposed on the FPC pad 151. When the touch screen is carried and positioned on the electrical testing jig, the FPC of the touch screen is configured to rest against the FPC pad 151 and connected to the FPC pressure head 152 and connected to the external circuit through the FPC pressure head 152, so as to achieve an external connection of the touch screen.

In other embodiments, the electrical connection assembly 150 may also be disposed on the second bracket 130 in other manners, such as in a detachable manner or the like, to achieve the position adjustment thereof on the second bracket 130. Moreover, in order to be adapted to the lead-out positions of the FPCs of different types of touch screens, the electrical connection assembly 150 may also be disposed on the first bracket 120 in a position-adjustable manner Certainly, in view of requirements for electrical connection of different types of touch screens, the electrical connection assembly 150 may also be disposed on the first bracket 120 or the second bracket 130 in a fixed manner. The present disclosure is not limited thereto.

In addition, in other embodiments, in order to realize the electrical connection of the touch screen, other designs or other electrical connection devices may also be applied to the electrical testing jig.

As shown in FIG. 1, in this embodiment, the reflector 160 is disposed on the substrate 110 and located between the first bracket 120 and the second bracket 130. That is, when the touch screen is carried and positioned on the first bracket 120 and the second bracket, the operator can use the reflector 160 to scan codes on the panel label attached to the S-surface of the touch screen. Through the above design, it is unnecessary for the operator to peel off the panel label from the S-surface of the touch screen and attach it to the G-surface, instead, the panel label attached to the S-surface facing the substrate 110 can be directly observed through the reflector 160.

In other embodiments, in order to achieve the above-described technical effects regarding the scanning of the panel label, other designs may also be used in this embodiment in place of the design of the reflector 160. For example, a code scanner may be provided below the substrate 110, and exposed to the position between the first bracket 120 and the second bracket 130 on the substrate 110. In this way, the code scanner can be used to automatically scan codes on the panel label attached to the S-surface of the touch screen.

In summary, the electrical testing jig according to the embodiments of the present disclosure is based on the structural design of first bracket and second bracket. When the touch screen to be tested is placed on the electrical testing jig, it is the edges of the touch panel to be supported between the first bracket and the second bracket, so that a wiring area of the S-surface of the touch screen is not in direct contact with the electrical testing jig, avoiding the situation that the electrical testing jig scratches the S-surface of the touch screen. In addition, the electrical testing jig positions the touch screen through the straight-shaped first step and two angular second steps, thereby realizing effective fixing of the touch screen by the electrical testing jig and avoiding a misjudgment of electrical testing due to plug-in trouble.

It should be noted herein that the electrical testing jig shown in the drawings and described in this specification is just one example of many kinds of electrical testing jigs that can adopt the principle of the embodiments of the present disclosure. It should be clearly understood that the principle of the embodiments of the present disclosure is not limited to any details or any components of the electrical testing jig shown in the drawings or described in this specification.

Exemplary embodiments of the electrical testing jig according to the present disclosure are described and/or illustrated in detail above. However, the embodiments of the present disclosure are not limited to the specific embodiments described herein, but rather, the components and/or steps of each embodiment may be used independently to and separately from the other components and/or steps described herein. Each component and/or step of one embodiment may also be used in combination with other components and/or steps of any other embodiments. When introducing elements, components and the like described and/or illustrated herein, the terms "a", "an", "above" and the like are intended to indicate the presence of one or more elements, components and the like. The terms "comprise", "include" and "have" are intended to be inclusive and mean that there may be additional elements, components and the like other than the listed elements, components and the like. Furthermore, the terms "first" and "second" in the claims and the specification are only used to differentiate objects, but are not intended to limit number of their objects.

Although the electrical testing jig provided by the present disclosure has been described according to different specific embodiments, it will be appreciated by those skilled in the art that the present disclosure may be modified within the spirit and scope of the claims.

What is claimed is:

1. An electrical testing jig for carrying and positioning a touch screen, comprising:
   a substrate;
   a first bracket on the substrate, the first bracket having a first step extending in a first direction on a top thereof;
   a second bracket on the substrate, the second bracket being spaced apart from the first bracket in a second direction perpendicular to the first direction and having two second steps spaced apart from each other in the first direction on a top of the second bracket, each of the second steps being angular; and
   an electrical connection assembly on the first bracket or the second bracket,
   wherein, the touch screen is carried and positioned on the electrical testing jig, and a circuit board of the touch screen is connected to an external circuit through the electrical connection assembly,
   wherein an FPC board is formed on a side edge of the touch screen, and the electrical connection assembly comprises:
   an FPC pad on the first bracket or the second bracket; and
   an FPC pressure head on the FPC pad;
   wherein, the FPC board is configured to rest against the FPC pad and connected to the FPC pressure head, so as to be connected to the external circuit through the FPC pressure head.

2. The electrical testing jig according to claim 1, wherein the substrate is provided with a first slideway extending in the second direction, and the first bracket cooperates with the first slideway slidably.

3. The electrical testing jig according to claim 1, wherein the substrate is provided with a first slideway extending in the second direction, and the second bracket cooperates with the first slideway slidably.

4. The electrical testing jig according to claim 1, wherein two positioning blocks spaced apart from each other in the first direction are provided on the top of the second bracket, each of the positioning blocks having an angular notch, and the second steps are respectively formed at two angular notches.

5. The electrical testing jig according to claim 4, wherein a second slideway extending in the first direction is provided on the top of the second bracket, and at least one of the two positioning blocks cooperates slidably with the second slideway.

6. The electrical testing jig according to claim 5, wherein the two positioning blocks both cooperate with the second slideway.

7. The electrical testing jig according to claim 6, wherein, an S-surface of the touch screen faces the substrate, and the S-surface is provided with a panel label, and the electrical testing jig further comprises:
   a reflector, on the substrate and between the first bracket and the second bracket, configured to project an image of the panel label to be scanned by a tester; or
   a code scanner, on the substrate and between the first bracket and the second bracket, configured to scan codes on the panel label.

8. The electrical testing jig according to claim 5, wherein, an S-surface of the touch screen faces the substrate, and the S-surface is provided with a panel label, and the electrical testing jig further comprises:

a reflector, on the substrate and between the first bracket and the second bracket, configured to project an image of the panel label to be scanned by a tester; or a code scanner on the substrate and between the first bracket and the second bracket, configured to scan codes on the panel label.

9. The electrical testing jig according to claim 4, wherein a second slideway extending in the first direction is provided on the top of the second bracket, and at least one of the two positioning blocks cooperates with the second slideway.

10. The electrical testing jig according to claim 9, wherein the electrical connection assembly cooperates with the second slideway and is located between the two positioning blocks.

11. The electrical testing jig according to claim 4, wherein, an S-surface of the touch screen faces the substrate, and the S-surface is provided with a panel label, and the electrical testing jig further comprises:

a reflector, on the substrate and between the first bracket and the second bracket, configured to project an image of the panel label to be scanned by a tester; or a code scanner, on the substrate and between the first bracket and the second bracket, configured to scan codes on the panel label.

12. The electrical testing jig according to claim 1, wherein the electrical connection assembly is position-adjustable on the first bracket or the second bracket.

13. The electrical testing jig according to claim 12, wherein, the touch screen is carried and positioned on the electrical testing jig, and an S-surface of the touch screen faces the substrate, and the S-surface is provided with a panel label, and the electrical testing jig further comprises:

a reflector, on the substrate and between the first bracket and the second bracket, configured to project an image of the panel label to be scanned by a tester; or a code scanner, on the substrate and between the first bracket and the second bracket, configured to scan codes on the panel label.

14. The electrical testing jig according to claim 1, wherein the substrate is provided with a first slideway extending in the second direction, and the first bracket and the second bracket both cooperate with the first slideway slidably.

15. The electrical testing jig according to claim 14, wherein the electrical testing jig comprises one, two or more first slideways.

16. The electrical testing jig according to claim 1, wherein the substrate is provided with a first slideway extending in the second direction, and the first bracket and the second bracket both cooperate with the first slideway slidably, wherein two positioning blocks spaced apart from each other in the first direction are provided on the top of the second bracket, each of the positioning blocks having an angular notch, and the second steps are respectively formed at two angular notches.

17. An electrical testing jig for carrying and positioning a touch screen, comprising:

a substrate;

a first bracket on the substrate, the first bracket having a first step extending in a first direction on a top thereof; and a second bracket on the substrate, the second bracket being spaced apart from the first bracket in a second direction perpendicular to the first direction and having two second steps spaced apart from each other in the first direction on a top of the second bracket, each of the second steps being angular, wherein, the touch screen is carried and positioned on the electrical testing jig, and an S-surface of the touch screen faces the substrate, and the S-surface is provided with a panel label, and the electrical testing jig further comprises:

a reflector, on the substrate and between the first bracket and the second bracket, configured to project an image of the panel label to be scanned by a tester; or a code scanner, on the substrate and between the first bracket and the second bracket, configured to scan codes on the panel label.

* * * * *